(12) United States Patent
Liu

(10) Patent No.: US 6,966,359 B1
(45) Date of Patent: Nov. 22, 2005

(54) RADIATOR PLATE RAPID COOLING APPARATUS

(76) Inventor: I-Ming Liu, No. 66-78, Shenkeng Village, Guanmiau Shiang, Tainan County (TW)

( * ) Notice: Subject to any disclaimer, the term of this patent is extended or adjusted under 35 U.S.C. 154(b) by 0 days.

(21) Appl. No.: 10/834,913

(22) Filed: Apr. 30, 2004

(51) Int. Cl.⁷ .............................................. F28D 15/00
(52) U.S. Cl. ............................... 165/104.21; 165/80.4; 165/104.33; 361/700; 174/15.2; 257/715
(58) Field of Search ....................... 165/104.33, 104.19, 165/104.21, 185, 80.3; 361/699, 700; 257/714–716; 174/15.2

(56) References Cited

U.S. PATENT DOCUMENTS

| | | | | |
|---|---|---|---|---|
| 3,490,718 A | * | 1/1970 | Vary ........................... | 244/163 |
| 3,901,311 A | * | 8/1975 | Kosson et al. .......... | 165/104.26 |
| 3,902,547 A | * | 9/1975 | Waters ........................ | 165/45 |
| 5,253,702 A | * | 10/1993 | Davidson et al. .......... | 165/80.4 |
| 5,283,715 A | * | 2/1994 | Carlsten et al. ............. | 361/702 |
| 5,646,824 A | * | 7/1997 | Ohashi et al. .............. | 361/699 |
| 5,697,428 A | * | 12/1997 | Akachi ................... | 165/104.21 |
| 6,163,073 A | * | 12/2000 | Patel ........................... | 257/712 |
| 6,564,860 B1 | * | 5/2003 | Kroliczek et al. ...... | 165/104.26 |
| 6,591,898 B1 | * | 7/2003 | Chu et al. ................... | 165/80.4 |
| 6,666,260 B2 | * | 12/2003 | Tantoush ................... | 165/80.3 |
| 2002/0023732 A1 | * | 2/2002 | Graf et al. .................. | 165/80.3 |
| 2004/0244950 A1 | * | 12/2004 | Zhou et al. ............ | 165/104.21 |

* cited by examiner

*Primary Examiner*—Terrell McKinnon
(74) *Attorney, Agent, or Firm*—Birch, Stewart, Kolasch & Birch, LLP

(57) ABSTRACT

A radiator plate rapid cooling apparatus includes a base deck and radiation fins located thereabove formed integrally by extrusion, forging or soldering. The base deck is located at the bottom end of the radiator plate and has passages formed by machining that house a capillary device placed therein or integrally formed by extrusion to become a double-layer passage loop. After being vacuumized, the loop is filled with a liquid or gas heat dissipation medium to the amount of 10% to 70% of the internal volume capacity of the passages. The base deck is in contact with a contact surface of a computer heat generating element. Heat may be concentrated on a heat absorption end of the base deck, transferred to the radiation fins, and be dispelled by a fan to improve heat dissipation.

16 Claims, 9 Drawing Sheets

RADIATOR PLATE RAPID COOLING APPARATUS

FIELD OF THE INVENTION

The present invention relates to a radiator plate rapid cooling apparatus adopted for use on personal or notebook computers, projectors and plasma television sets and the like that have heat generating sources.

BACKGROUND OF THE INVENTION

Nowadays computer applications have been widely adopted in almost every aspect of people's life. With the data processing speed of the computer increased constantly, heat generated by computer elements during operation also increases. Timely heat dissipation has become an issue that must be resolved satisfactorily for normal computer operation. The radiator for the present personal or notebook computer that is widely used today generally includes a metal base deck with a plurality of fin type radiator plates mounting thereon in an upright manner. The lower side of the base deck is a flat surface. For installation, the radiator is coupled on a computer heat generating element by means of an eccentric fixture to make the lower flat surface in contact tightly with the heat generating element. A radiation fan is mounted above the radiator plates. When the computer is in operation, according to heat transfer principle, the heat generated by the computer element passes through the flat contact surface of the radiator to the base deck and the radiator plates, and the fan generates airflow to carry the heat away. Such a heat dissipation method is simply based on metal heat conduction. Heat dissipation efficiency depends on the heat conductive capability of the material that forms the radiator. As the solid substance has limited heat transfer capability, heat dissipation effect of the conventional radiators also is limited.

SUMMARY OF THE INVENTION

In view of the aforesaid disadvantages occurred to the conventional radiators that have limited heat dissipation capability, the present invention aims to provide a radiator plate structure to improve heat dissipation effect. The radiator plate structure according to the invention includes a base deck and radiation fins that may be fabricated and connected together, or the base deck may be used independently.

The main features of the invention are on the base deck and the radiation fins. They may be integrally formed by extrusion, forging or soldering. The base deck at the bottom end of the radiator plate has passages formed by machining. The passages house a capillary means which is integrally formed to become a double-layer passage loop. After being vacuumed, the loop is filled with a liquid or gas heat dissipation medium to the amount about 10% to 70% of the internal volume capacity of the passages. Thus heat may concentrate on a heat absorption end of the base deck and pass through the radiation fins and be dispelled by the fan to achieve heat dissipation effect.

Compared with the conventional radiators, the invention can achieve a lot of advantages, notably:

The base deck at the bottom end of the radiator plates has loops consisting of double-layer passages that contain integrated capillary means formed by extrusion or placed therein. And a liquid or gas heat dissipation medium is filled in the loop. The heat dissipation medium can be transformed from liquid phase to vapor phase and to the liquid phase again. And during this cyclical phase transformation the heat dissipation medium absorbs heat, releases heat and absorbs heat again. The contact surface of the base deck of the radiator plates can absorb operation heat of the computer elements and release the heat to the radiation fins. Thus heat dissipation capability of the radiator plates improves, and heat dissipation efficiency of the radiator plates increases.

The foregoing, as well as additional objects, features and advantages of the invention will be more readily apparent from the following detailed description, which proceeds with reference to the accompanying drawings.

The present invention will become more fully understood from the detailed description given hereinbelow and the accompanying drawings which are given by way of illustration only, and thus are not limitative of the present invention, and wherein:

DETAILED DESCRIPTION OF THE PREFERRED EMBODIMENTS

Figure 1A:
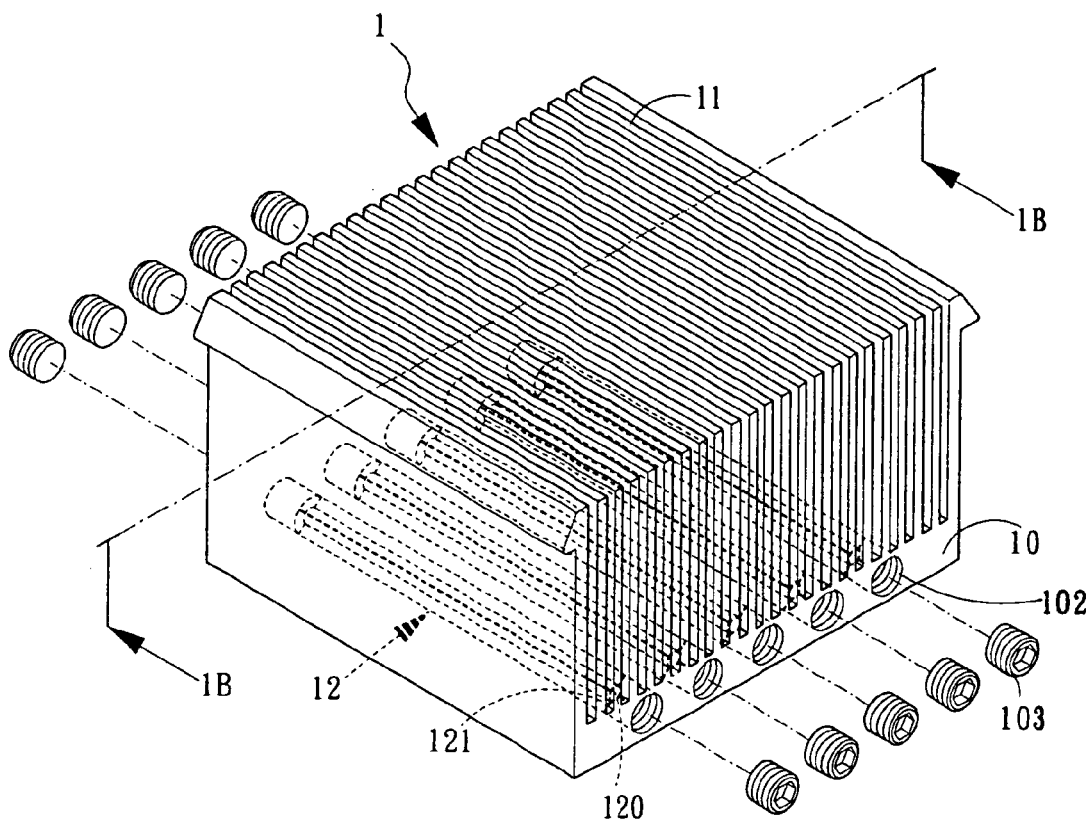
FIG. 1A is an exploded view of a first embodiment of the present invention.
Figure 1B:
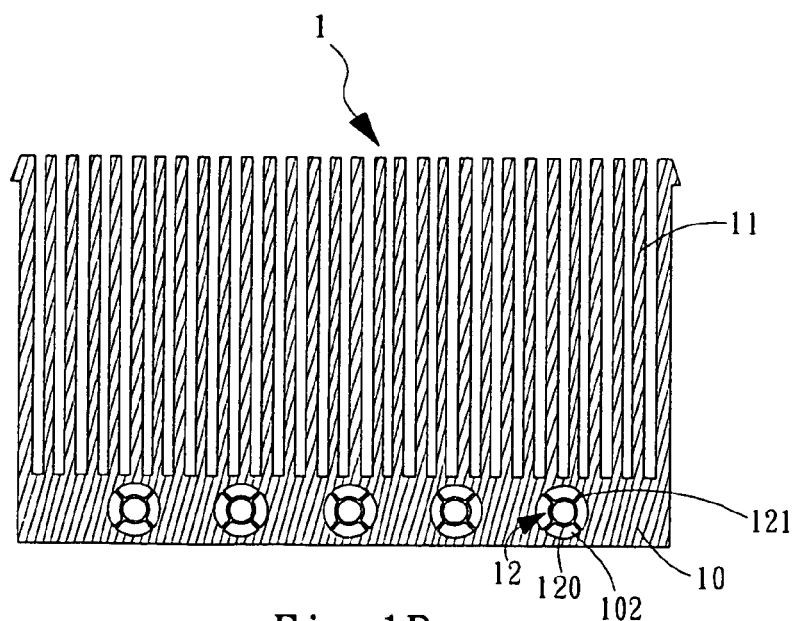
FIG. 1B is a cross section taken on line 1B—1B in FIG. 1A.

Please referring to FIGS. 1A and 1B, the radiator plate 1 according to the invention includes a base deck 10 and radiation fins 11 located above the base deck 10 that are integrally formed from aluminum or copper by extrusion, forging or soldering. The base deck 10 has passages 102 formed therein. The passages 102 house a capillary means 12 that is integrally formed with the passages by extrusion to become a double-layer passage loop. The radiator plate 1 thus formed may be used on personal or notebook computers, projectors and plasma television sets and the like that have heat generating sources for heat dissipation.

The base deck 10 is in contact with a heat generating element of the computer to absorb heat. The passages 102 in the base deck 10 are formed by machining to become a closed loop. The passages 102 house the integrated capillary means 12 that is formed by extrusion or placed therein. In addition, the base deck 10 and the radiation fins 11 may be coupled to become one body for use. It also may be used independently on a small computer element.

The radiation fins 11 are mounted on the base deck 10 which has a heat absorption end to transfer heat to the radiation fins 11, then the heat is dispelled by a fan.

The capillary means 12 is integrally formed with the passages 102 of the base deck 10 by extrusion. The capillary means 12 includes a circular tube 120 with at least one spacer 121 formed on the periphery. The capillary means 12 may be cut to a selected length to suit different computer elements.

Figure 2:
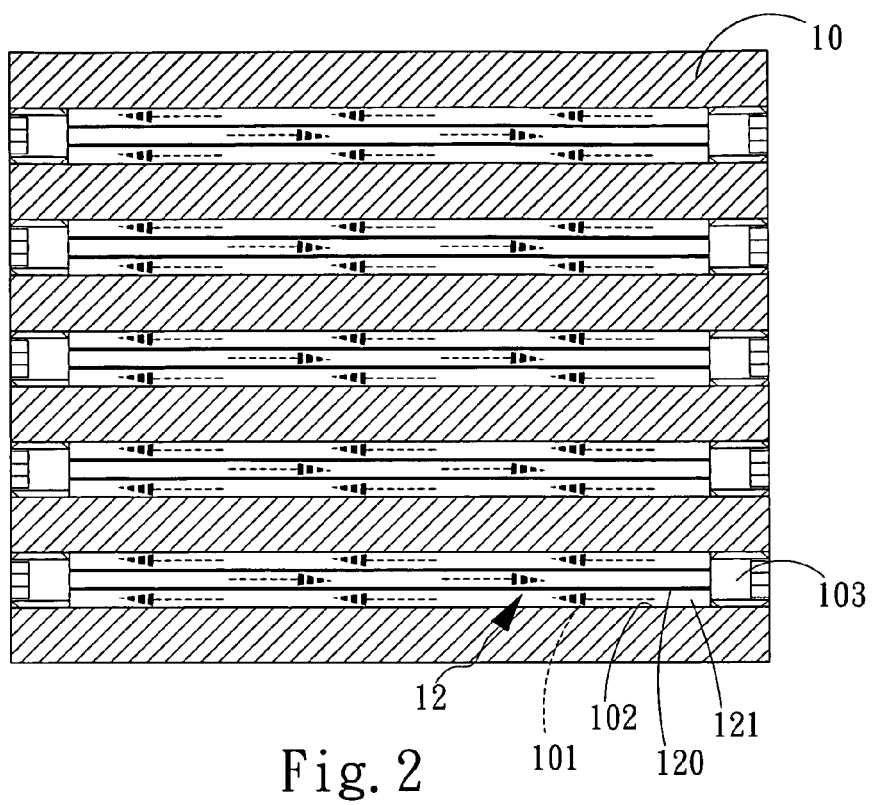
FIG. 2 is a schematic view of circulating heat dissipation of the heat dissipation medium according to FIG. 1A.

Referring to FIG. 2; the passages 102 in the base deck 10 house the extruded capillary means 12 therein to form a double-layer passage loop. Each of the passages 102 has exits on both ends sealed respectively by a plug 103 so that the passage 102 forms a closed loop. After being vacuumized, the passages 102 are filled with a liquid or gas heat dissipation medium 101 to the amount of 10% to 70% of the internal volume capacity of the passages 102 (indicated by arrows in FIG. 2).

The radiator plate 1 has a flat surface in intimate contact with a computer element (or other heat generating element) after installation. Heat generated by the computer element during operation passes through the contact surface to the radiator plate 1. On the one hand, the base deck 10 transfers the heat by conduction to the radiation fins 11. On the other hand the heat dissipation medium 101 contained in the passages 102 absorbs heat from the high temperature contact surface and is transformed from liquid phase to vapor phase, and absorbs the heat transferred from the computer element (or other heat generating element). The vapor phase heat dissipation medium 101 is cooled by the lower temperature radiation fins 11 and transformed from the vapor phase to the liquid phase and releases heat to the radiation fins 11. Thus the heat dissipation medium 101 repeatedly goes through the phase transformation cycle of liquid phase—vapor phase—liquid phase to perform heat transfer process of heat absorption—heat release—heat absorption again. Finally the fan generates airflow to dispel the heat from the radiation fins 11. The process set forth above provides double heat dissipation and can greatly improve heat dissipation efficiency of the radiator plate 1.

Figure 3:
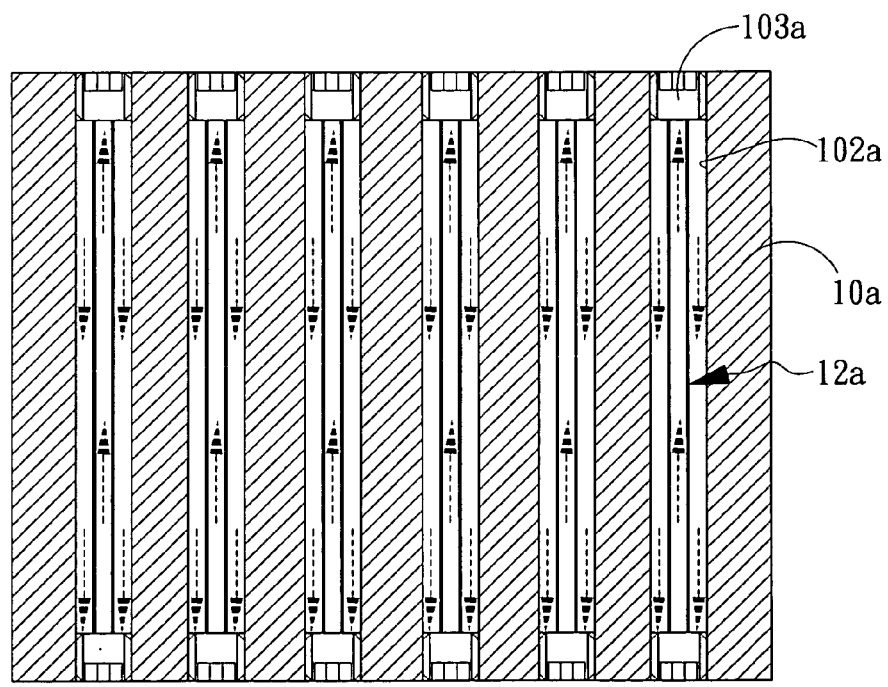
FIG. 3 is a schematic view of heat dissipation medium circulation according to a second embodiment of the invention.

Refer to FIG. 3 for another embodiment of the invention. It is largely, like the one shown in FIG. 1A. The difference is that the passages 102a in the base deck 10a are formed longitudinally by extrusion. They also contain integrated capillary means 12a formed by extrusion. And the exit ends of the passages 102a are sealed by plugs 103a.

Figure 4:
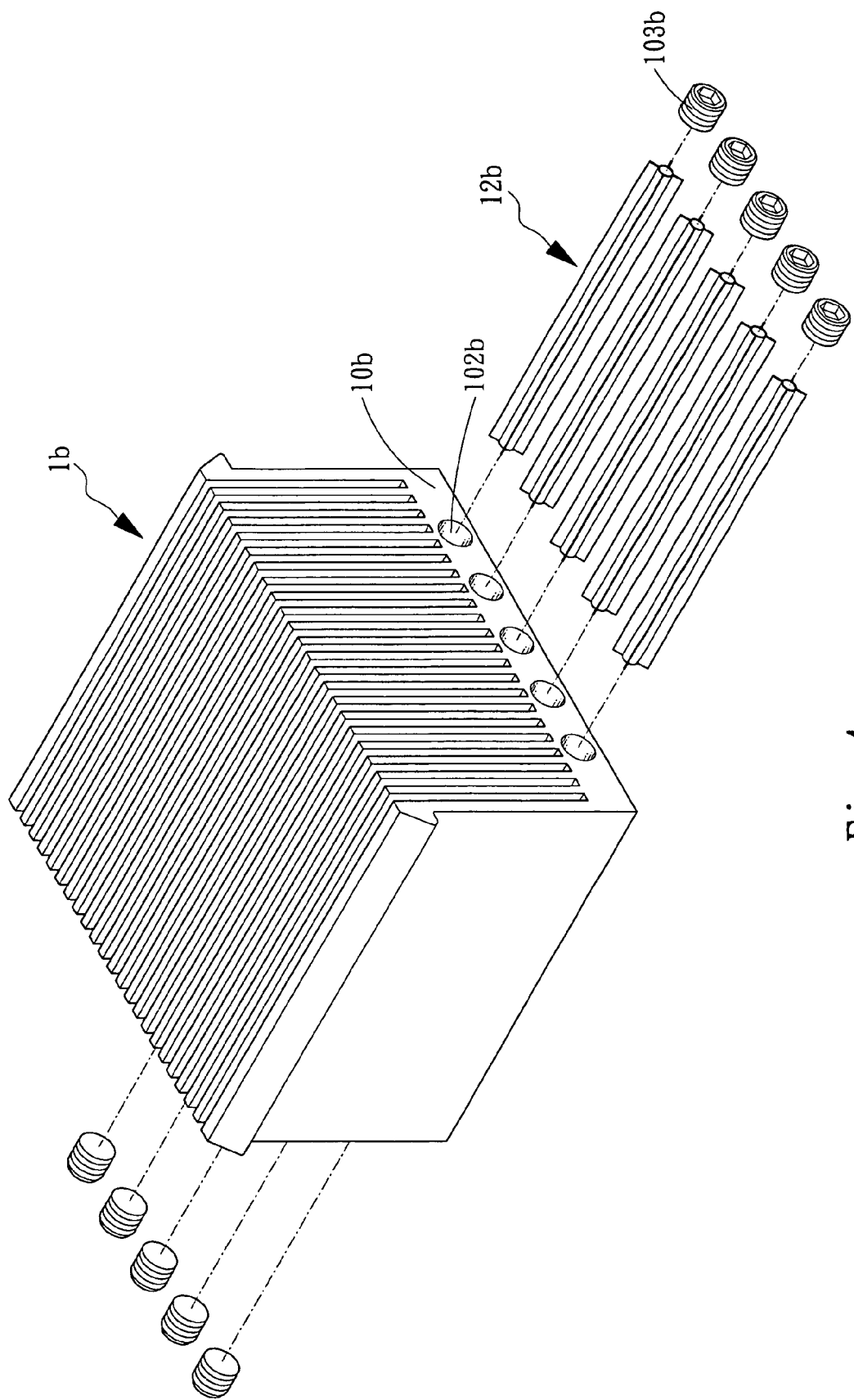
FIG. 4 is an exploded view of a third embodiment of the present invention.
Figure 5:
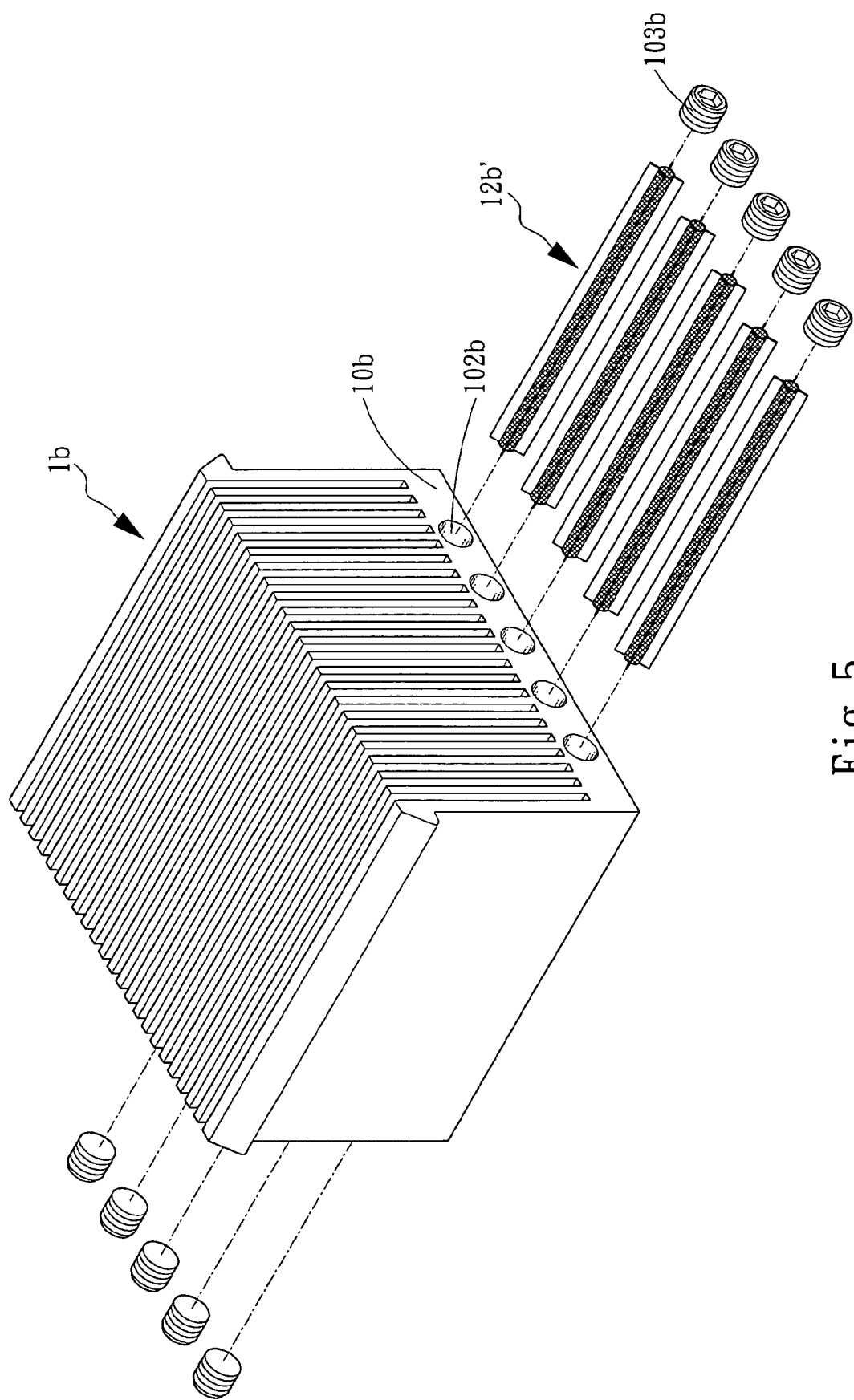
FIG. 5 is an exploded view of a fourth embodiment of the present invention.

Refer to FIG. 4 for yet another embodiment of the invention. It is largely like the one shown in FIG. 1A. The difference is that the passages 102b in the base deck 10b are formed by machining to contain integrated capillary means 12b formed by extrusion (or mesh and barrel type capillary means 12b' as shown in FIG. 5) to become a double-layer passage loop, and the exit ends of the passages 102b are sealed by plugs 103b.

Figure 6:
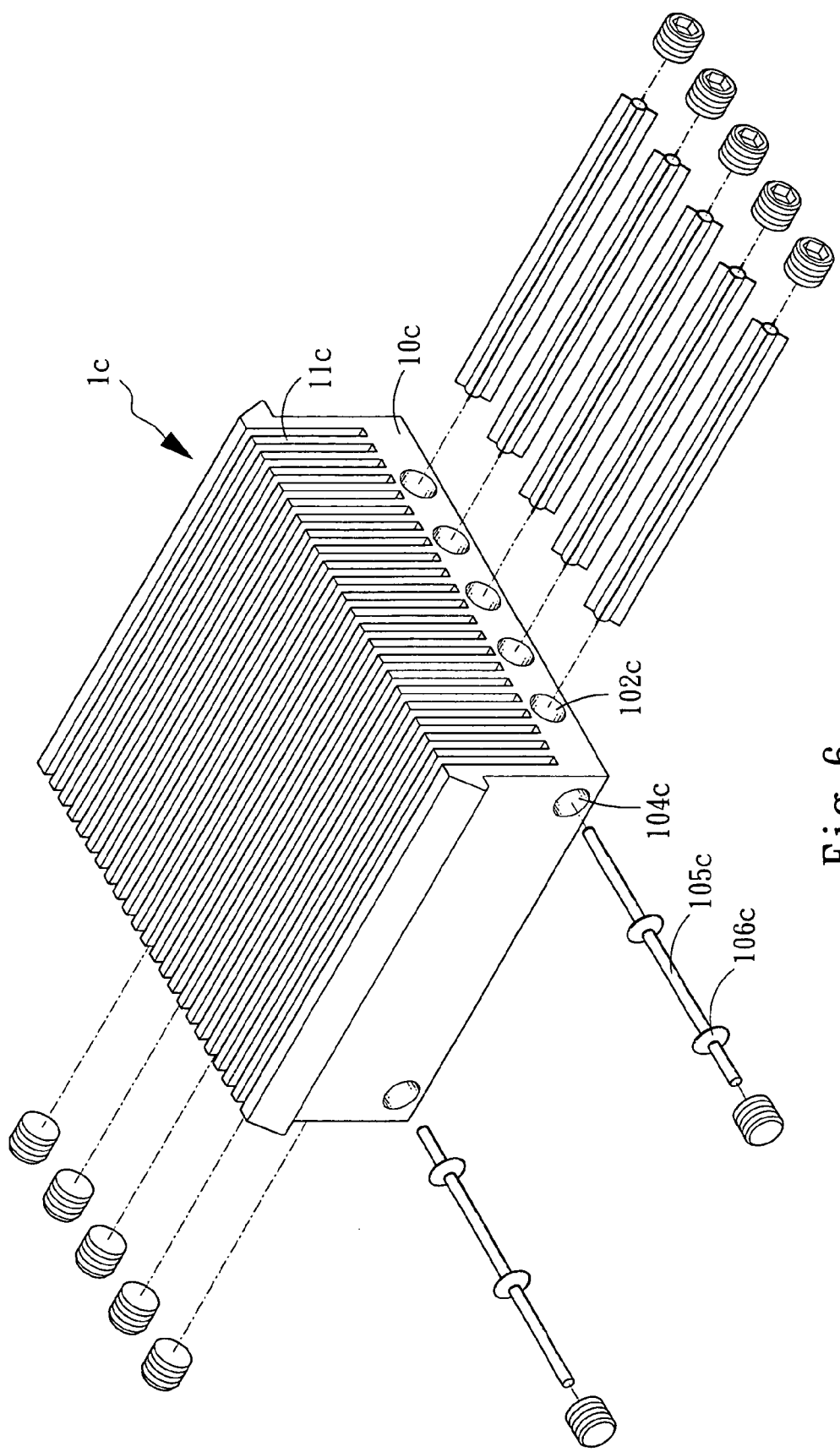
FIG. 6 is an exploded view of a fifth embodiment of the present invention.

Refer to FIG. 6 for still another embodiment of the invention. It is largely like the one shown in FIG. 4. The difference is that the radiator plate 1c has a base deck 10c of the same height as that shown in FIG. 4, the radiation fins 11c are formed with different heights and density according to the space size available around the heat generating element. The base deck 10c further has longitudinal passages 104c on two sides of the passages 102c that contain a partition plate 105c with a plurality of conical and staggered spacers 106c located thereon to partition the passages 102c to become a single loop.

Figure 7:
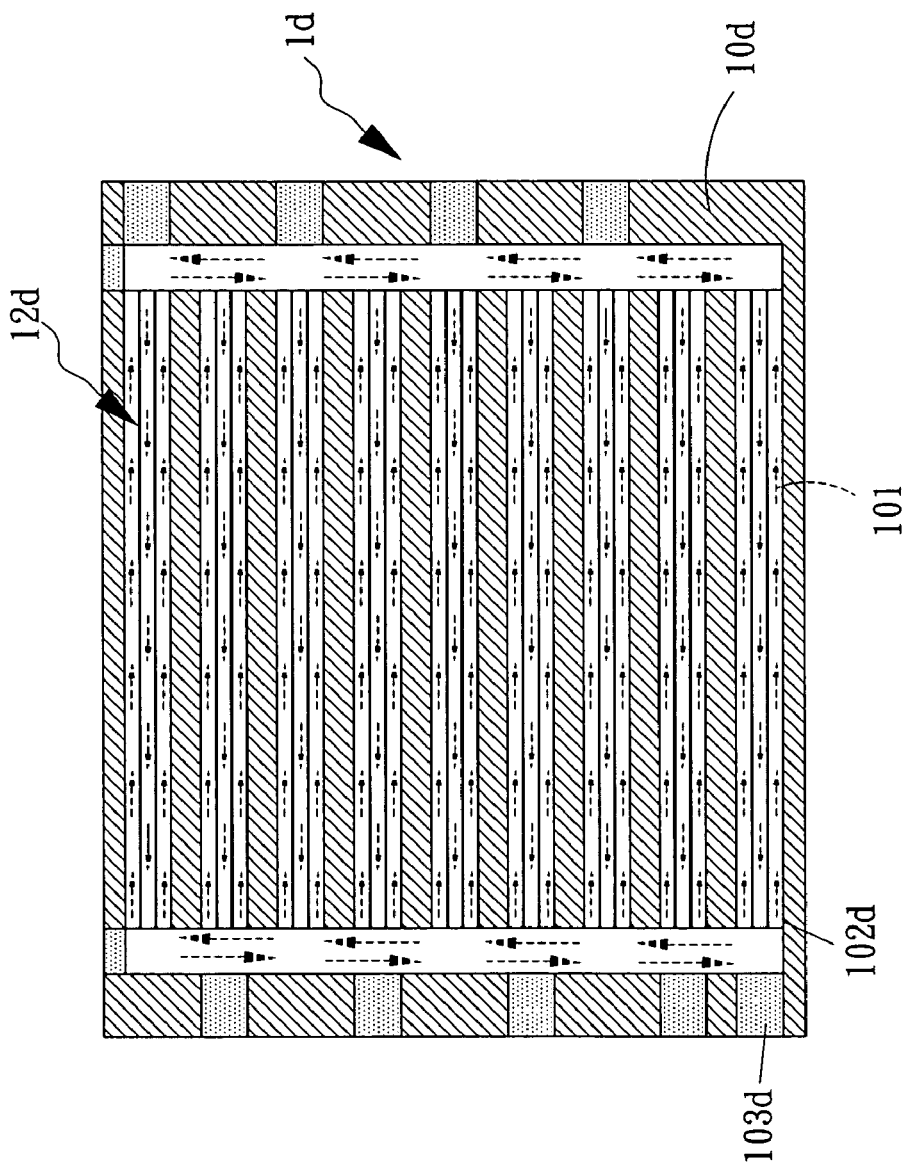
FIG. 7 is a schematic view of heat dissipation medium circulation according to a sixth embodiment of the invention.

Refer to FIG. 7 for another embodiment of the invention. It is largely like the one shown in FIG. 1A. The difference is that the base deck 10d at the bottom end of the radiator plate 1d contains reciprocal passages 102d formed by machining or extrusion that have two ends communicating with one another. Each reciprocal passage 102d contains an integrated capillary means 12d placed therein or formed by extrusion. The exits of the reciprocal passages 102d are sealed by plugs 103d. After being vacuumed, the passages 102d are filled with the heat dissipation medium 101 (shown by arrows in FIG. 7) to the amount of 10% to 70% of the internal volume capacity of the reciprocal passages 102d.

Figure 8:
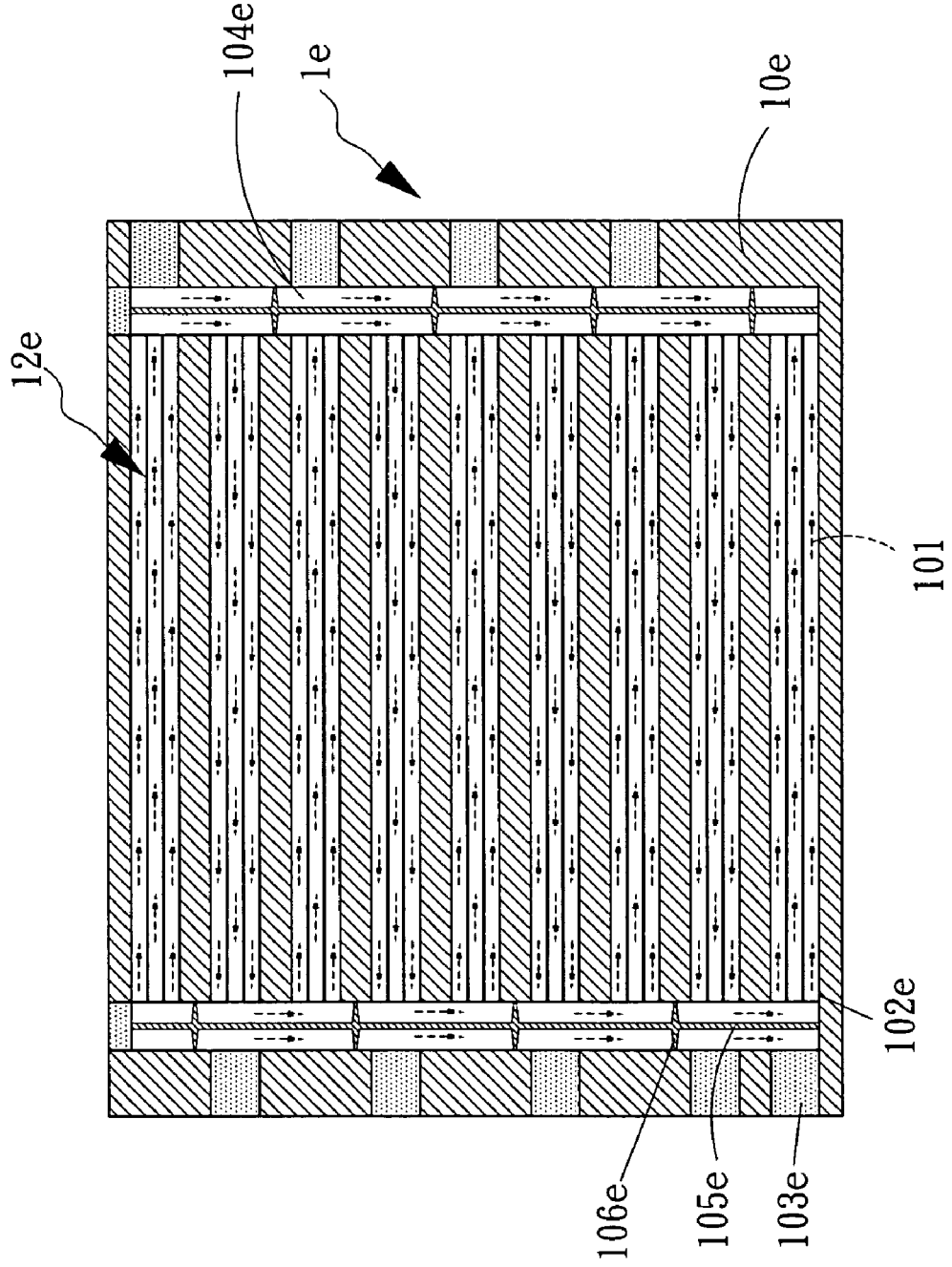
FIG. 8 is a schematic view of heat dissipation medium circulation according to a seventh embodiment of the invention.

Refer to FIG. 8 for another embodiment of the invention. It is largely like the one shown in FIG. 7. The difference is that the base deck 10e at the bottom end of the radiator plate 1e contains reciprocal passages 102e formed by machining or extrusion that have two ends communicating with one another. Each reciprocal passage 102e contains an integrated capillary means 12e placed therein or formed by extrusion. There are longitudinal passages 104e on two sides of the passages 102e that contain a partition plate 105e with a plurality of conical and staggered spacers 106e located thereon to partition the reciprocal passage 102e to become a single loop. The exit ends of the passages are sealed by plugs 103e. After being vacuumized, the reciprocal passages 102e are filled with the heat dissipation medium 101 (shown by arrows in FIG. 8) to the amount of 10% to 70% of the internal volume capacity of the reciprocal passages 102e.

Figure 9:
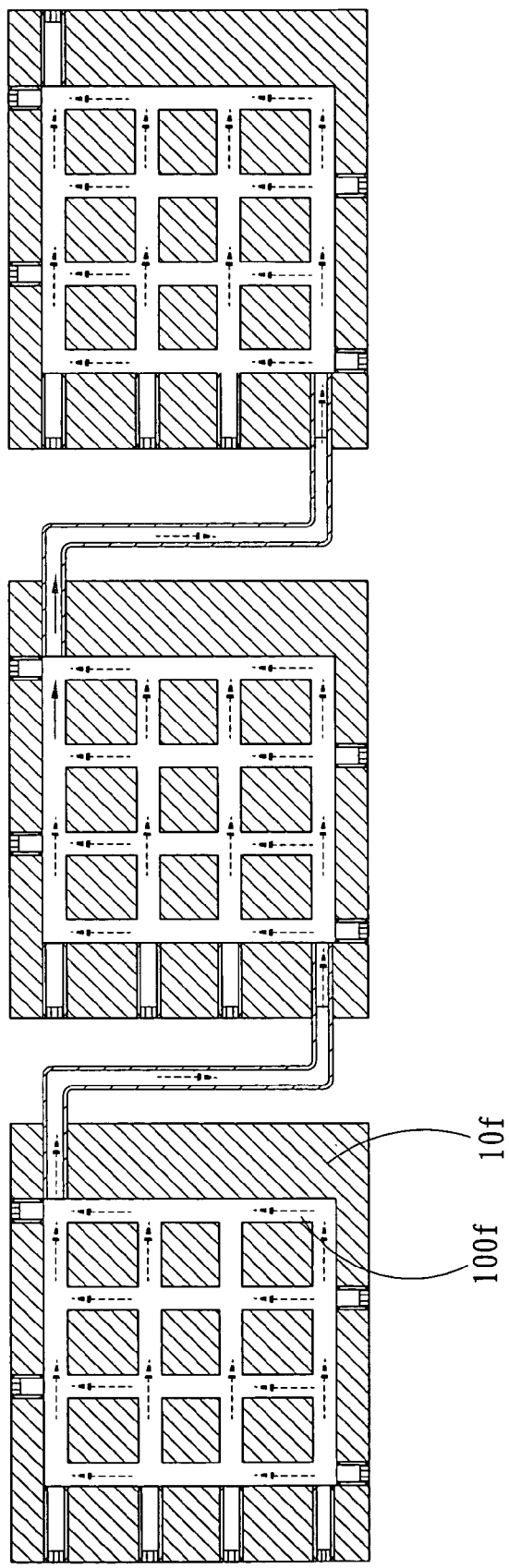
FIG. 9 is a schematic view of an eighth embodiment of the invention coupled in series.

Refer to FIG. 9 for another embodiment of the invention. It is largely like the one shown in FIG. 1A. The difference is that the base deck 10f has an exit connection end and an inlet connection end to couple with the passages, and other end to connect to an external heat exchange circulation system to form an open loop 10f. Depending on the space available on the heat generation source, two or more base decks 10f may be coupled in series to form an open loop.

Figure 10:
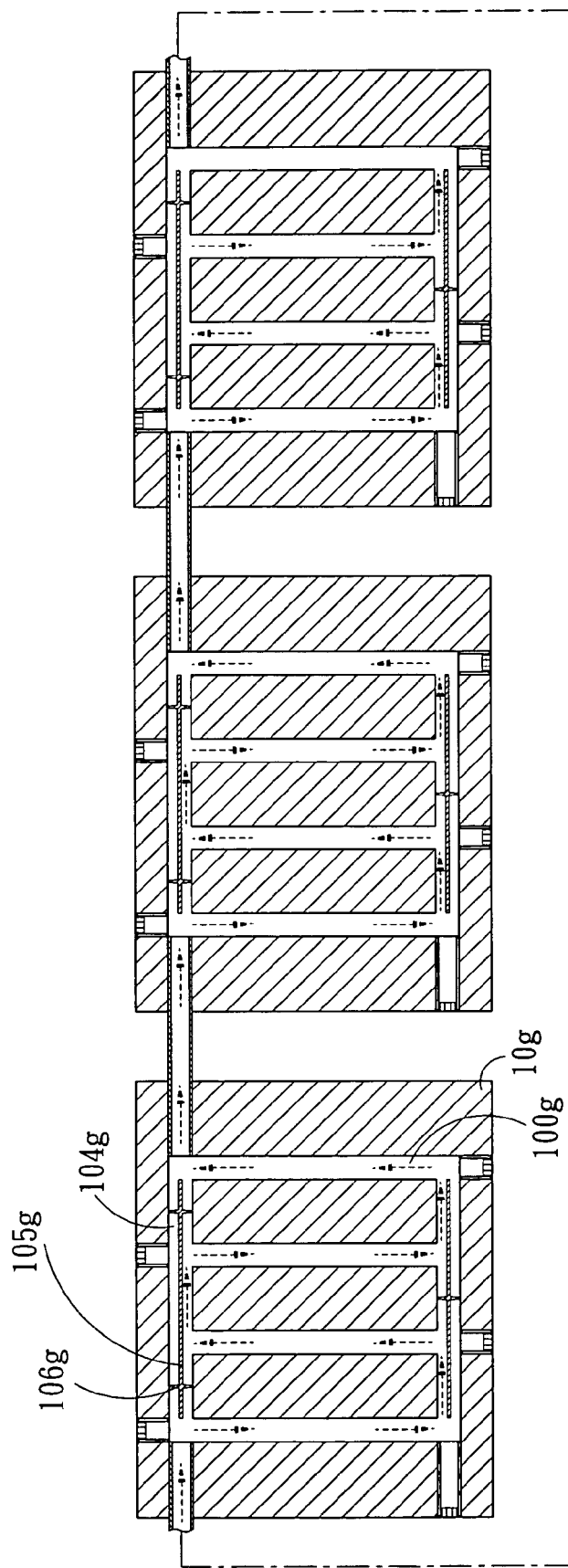
FIG. 10 is a schematic view of a ninth embodiment of the invention coupled in series.

Refer FIG. 10 for another embodiment of the invention. It is largely like the one shown in FIG. 1A. The difference is that the base deck 10g has transverse passages 104g located on two sides of longitudinal passages 100g that communicate with one another. And each of the transverse passages 104g contains a partition plate 105g with a plurality of conical and staggered spacers 106g located thereon. Depending on space available on the heat generation source, two or more base decks 10g may be coupled in series to form a single loop of closed passages.

The invention being thus described, it will be obvious that the same may be varied in many ways. Such variation are not to be regarded as a departure from the spirit and scope of the invention, and all such modifications as would be obvious to one skilled in the art are intended to be included within the scope of the following claims.

What is claimed is:

1. A radiator plate rapid cooling apparatus comprising a base deck and radiation fins located above the base deck, the base deck having passages formed therein that contain a capillary means formed by extrusion to form a closed loop of double-layer passages, the closed loop being vacuumized and filled with a heat dissipation medium, the base deck having a heat absorption end to transfer heat to the radiation fins located thereabove to allow the heat to be dispelled by a fan to achieve heat dissipation effect, the passages are reciprocal and have two ends which communicate with one another and house the capillary means which is placed therein or formed by integrated extrusion.

2. The radiator plate rapid cooling apparatus of claim 1, wherein the radiator plate is adopted for use on personal or notebook computers, projectors and plasma television sets and other devices that have heat generating sources.

3. The radiator plate rapid cooling apparatus of claim 1, wherein the base deck and the radiation fins are formed in an integrated manner by extrusion, forging or soldering.

4. The radiator plate rapid cooling apparatus of claim 1, wherein the base deck and the radiation fins are selectively made from aluminum or copper.

5. The radiator plate rapid cooling apparatus of claim 1, wherein the base deck is mountable independently on a heat generating element.

6. The radiator plate rapid cooling apparatus of claim 1, wherein the capillary means has a round tube in the center with spacers formed on the periphery thereof.

7. The radiator plate rapid cooling apparatus of claim 1, wherein the heat dissipation medium is selectively liquid or gas.

8. The radiator plate rapid cooling apparatus of claim 1, wherein the heat dissipation medium is filled to the amount of 10% to 70% of the internal volume capacity of the passages.

9. The radiator plate rapid cooling apparatus of claim 1, wherein the base deck has longitudinal passages formed therein.

10. The radiator plate rapid cooling apparatus of claim 1, wherein the base deck is located on the bottom end of the radiator plate and has the passages formed therein, the passages housing the capillary means which is placed therein or formed by integrated extrusion to form a loop of double-layer passages.

11. The radiator plate rapid cooling apparatus of claim 10, wherein the capillary means is formed in a mesh and barrel fashion.

12. The radiator plate rapid cooling apparatus of claim 10, wherein the radiator plate includes a base deck of a same height and radiation fins of varying heights and densities according to the space size of a heat generating source.

13. The radiator plate rapid cooling apparatus of claim 1, further having longitudinal passages located at two ends of the reciprocal passages, the longitudinal passages housing a partition plate to partition the reciprocal passages to become a single loop.

14. The radiator plate rapid cooling apparatus of claim 13, wherein the partition plate is made by integrated plastic injection and has conical spacers formed on the periphery thereof.

15. The radiator rapid cooling apparatus of claim 1, wherein the base deck has an exit connection end an inlet connection end that have one end connecting to the passage and other end connecting to an external heat exchange circulation system to form an open loop, the open loop being connectable in series.

16. The radiator plate rapid cooling apparatus of claim 1, wherein the base deck is coupled in series to form a closed loop and has transverse passages containing a partition plate to form a single loop.

* * * * *